United States Patent
Papandreou et al.

(10) Patent No.: US 9,190,171 B2
(45) Date of Patent: Nov. 17, 2015

(54) METHOD AND APPARATUS FOR READ MEASUREMENT OF A PLURALITY OF RESISTIVE MEMORY CELLS

(71) Applicant: International Business Machines Corporation, Armonk, NY (US)

(72) Inventors: Nikolaos Papandreou, Thalwil (CH); Charalampos Pozidis, Thalwil (CH); Abu Sebastian, Adliswil (CH)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 6 days.

(21) Appl. No.: 14/154,560

(22) Filed: Jan. 14, 2014

(65) Prior Publication Data

US 2014/0211540 A1    Jul. 31, 2014

(30) Foreign Application Priority Data

Jan. 30, 2013    (GB) .................................. 1301621.7

(51) Int. Cl.
G11C 11/00    (2006.01)
G11C 29/00    (2006.01)
(Continued)

(52) U.S. Cl.
CPC ............ G11C 29/00 (2013.01); G11C 11/5678 (2013.01); G11C 13/004 (2013.01); G11C 29/021 (2013.01); G11C 29/028 (2013.01);
(Continued)

(58) Field of Classification Search
CPC .................. G11C 13/004; G11C 11/16; G11C 2013/0054; G11C 2013/0057; G11C 13/0069; G11C 2013/005; G11C 2013/0052; G11C 29/021; G11C 5/147; G11C 11/5642; G11C 13/0002

USPC .......... 365/148, 208, 189.09, 189.15, 226, 63
See application file for complete search history.

(56) References Cited

U.S. PATENT DOCUMENTS 7,885,101 B2    2/2011    Bedeschi et al.
7,944,740 B2    5/2011    Lam et al.
(Continued)

FOREIGN PATENT DOCUMENTS

EP    11183336.4    4/2013

OTHER PUBLICATIONS

Joshi, Madhura et al., "Mercury: A Fast and Energy-Efficient Multi-Level Cell Based Phase Change Memory System", High Performance Computer Architecture (HPCA), 2011 IEEE 17th International Symposium, Feb. 2011, pp. 345-356, ISSN 1530-0897, San Antonio TX.

(Continued)

*Primary Examiner* — Thong Q Le
(74) *Attorney, Agent, or Firm* — Jeff Tang

(57) ABSTRACT

A method for read measurement of a plurality N of resistive memory cells having a plurality K of programmable levels. The method includes a step of applying a first read voltage to each of the plurality N of resistive memory cells and, at each of the plurality N of resistive memory cells, measuring a first read current due to the applied first read voltage, determining a respective second read voltage based on the first read current measured at the plurality N of resistive memory cells and a target read current determined for the plurality N of resistive memory cells for each of the plurality N of resistive memory cells, and applying the respective determined second read voltage to the plurality N of resistive memory cells for obtaining a second read current for each of the plurality N of resistive memory cells.

13 Claims, 8 Drawing Sheets

(51) Int. Cl.
  *G11C 29/02* (2006.01)
  *G11C 29/50* (2006.01)
  *G11C 11/56* (2006.01)
  *G11C 13/00* (2006.01)

(52) U.S. Cl.
  CPC .......... *G11C 29/50008* (2013.01); *G11C 13/00* (2013.01); *G11C 13/0004* (2013.01); *G11C 2013/005* (2013.01); *G11C 2013/0052* (2013.01)

(56) References Cited

U.S. PATENT DOCUMENTS

| | | | |
|---|---|---|---|
| 8,040,723 | B2 | 10/2011 | Sheu et al. |
| 8,081,501 | B2 | 12/2011 | Choi et al. |
| 2009/0016100 | A1 | 1/2009 | Jeong |
| 2009/0303785 | A1* | 12/2009 | Hwang et al. ................ 365/163 |
| 2011/0242884 | A1 | 10/2011 | Eleftheriou et al. |
| 2012/0092923 | A1 | 4/2012 | Bedeschi et al. |

OTHER PUBLICATIONS

Wong, H.-S Philip et al., "Recent Progress of Phase Change Memory (PCM) and Resisitve Switching Random Access Memory (RRAM)", ICSICT, 2010, Proc. IEEE.

Papandreou, N. et al., "Enabling Technologies for Multilevel Phase-Change Memory", European Phase Change and Ovonics Symposium, 2011.

Pozidis, H. et al., "A Framework for Reliability Assessment in Multilevel Phase-Change Memory", Memory Workshop (IMW), pp. 1-4, May 2012, 2012 4th IEEE International.

\* cited by examiner

METHOD AND APPARATUS FOR READ MEASUREMENT OF A PLURALITY OF RESISTIVE MEMORY CELLS

CROSS-REFERENCE TO RELATED APPLICATION

This application claims priority under 35 U.S.C. §119 from Patent Application No. GB1301621.7 filed Jan. 30, 2013, the entire contents of which are incorporated herein by reference.

BACKGROUND OF THE INVENTION

1. Field of the Invention

The present invention relates to the field of integrated circuit memories, more specifically, the present invention relates to a method and to an apparatus for read measurement of a plurality of resistive memory cells having a plurality of programmable levels.

2. Description of Related Art

A prominent example for resistive memory cells having a plurality of programmable levels is Resistive Random Access Memory (RRAM), particular Phase Change Memory (PCM). PCM is a non-volatile solid-state memory technology that exploits the reversible, thermally-assisted switching of specific chalcogenides between certain states of different electrical conductivity.

PCM is a promising and advanced emerging non-volatile memory technology mainly due to its excellent features including low latency, high endurance, long retention and high scalability. PCM can be considered a prime candidate for Flash replacement, embedded/hybrid memory and storage-class memory. Key requirements for competitiveness of PCM technology can be multi-level cell functionality, in particular for low cost per bit, and high-speed read/write operations, in particular for high bandwidth. Multilevel functionality, i.e. multiple bits per PCM cell, can be a way to increase storage capacity and thereby to reduce cost.

Multi-level PCM is based on storing multiple resistance levels between a lowest (SET) and a highest (RESET) resistance value. Multiple resistance levels or levels correspond to partial-amorphous and partial-crystalline phase distributions of the PCM cell. Phase transformation, i.e. memory programming, can be enabled by Joule heating. In this regard, Joule heating can be controlled by a programming current or voltage pulse. Storing multiple resistance levels in a PCM cell is a challenging task.

In Wong, H.-S Philip et al., "Recent Progress of Phase Change Memory and Resisitve Switching Random Access Memory", ICSICT, 2010, Proc. IEEE, it is described that multi-level cell (MLC) programming is the most efficient way to increase the storage capacity of PCM. In order to achieve MLC programming, an iterative algorithm can be used, which adapts the programming current to the characteristics of each cell in every cycle so that the cell is programmed to the desired cell-state with minimum write latency (PAPANDREOU, N. et al., "Enabling Technologies for Multilevel Phase-Change Memory", European Phase Change and Ovonics Symposium, 2011).

When reading MLC data from a memory array including a plurality of memory cells, the read-back signals form Gaussian-like distributions corresponding to the different levels. This is mainly due to noise during the read process, a distribution of programmed cell-states for each level within each target bin during the write process and a non-uniform drift of the difference resistance levels (POZIDIS, H. et al., "A Framework for Reliability Assessment in Multilevel Phase-Change Memory", Memory Workshop (IMW), pages 1-4, May 2012, 2012 4th IEEE International). Further, the actual level statistics are data-dependent and typically change over time. As a result, an estimation of the first and second-order statistics is essential for reliable level detection (European Patent Application No. 11183336.4). The accuracy of the estimation depends heavily on the number of available data. In main memory applications and hybrid memory applications, the number of data that is collected during memory access can be limited.

Accordingly, it is an aspect of the present invention to improve the read measurement of a plurality of resistive memory cells.

BRIEF SUMMARY OF THE INVENTION

The present invention provides a method for read measurement of a plurality N of resistive memory cells having a plurality K of programmable levels, the method including: applying a first read voltage to the plurality N of resistive memory cells; measuring a first read current due to the first read voltage; determining a second read voltage based on the first read current measured at the plurality N of resistive memory cells; determining a target read current for the plurality N of resistive memory cells; applying the second read voltage to the plurality N of resistive memory cells; and obtaining a second read current.

Another aspect of the present invention provides an apparatus for read measurement of a plurality N of resistive memory cells having a plurality K of programmable levels, the apparatus including: a voltage generator for applying a voltage to the plurality N of resistive memory cells; a measurement circuit for making a measurement indicative of cell current; a controller for controlling operation; wherein the voltage generator applies a first read voltage to the plurality N of resistive memory cells; wherein the measurement circuit measures a first read current due to the first read voltage; wherein the controller determines a second read voltage for the plurality N of resistive memory cells based on the first read current and a target read current determined for the plurality N of resistive memory cells; and wherein the voltage generator applies the second read voltage to the plurality N of resistive memory cells for obtaining a second read current for the plurality N of resistive memory cells.

Another aspect of the present invention provides a resistive memory device including: a memory including a plurality N of resistive memory cells having a plurality K of programmable levels; a voltage generator for applying a voltage to the plurality N of resistive memory cells; a measurement circuit for making a measurement indicative of cell current; a controller for controlling operation; wherein the voltage generator applies a first read voltage to the plurality N of resistive memory cells; wherein the measurement circuit measures a first read current due to the first read voltage; wherein the controller determines a second read voltage for the plurality N of resistive memory cells based on the first read current and a target read current determined for the plurality N of resistive memory cells; and wherein the voltage generator applies the second read voltage to the plurality N of resistive memory cells for obtaining a second read current for the plurality N of resistive memory cells.

BRIEF DESCRIPTION OF THE DRAWINGS

Similar or functionally similar elements in the figures have been allocated the same reference signs if not otherwise indicated.

DETAILED DESCRIPTION OF THE PREFERRED EMBODIMENTS

Figure 1:
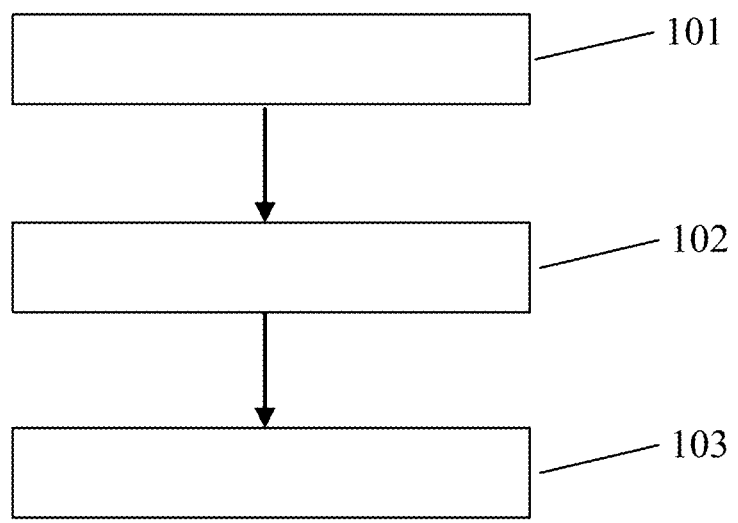
FIG. 1 shows a sequence of method steps for read measurement of a plurality of resistive memory cells, according to an embodiment of the present invention.

According to an embodiment of a first aspect of the present invention, a method for read measurement of a plurality N of resistive memory cells having a plurality K of programmable levels is described. The method includes a step of applying a first read voltage to each of a plurality N of resistive memory cells and, at each of the plurality N of resistive memory cells, measuring a first read current due to an applied first read voltage, a step of determining a respective second read voltage based on the first read current measured at the memory cell and a target read current determined for the memory cell for each of the plurality N of resistive memory cells, and a step of applying the respective determined second read voltage to the memory cell for obtaining a second read current for each of the plurality N of resistive memory cells.

According to embodiments of the invention, a two-step read process is used for improving read signals from multi-level cell distributions. In the two-step read process, all memory cells are read at a first read voltage in a first step and with a second read voltage in the second step. In most cases, the second read voltage is different from the first read voltage. But, for the case that the first read current is equal to the mean value of the read current distribution, the second read voltage is the same as the first read voltage. Thereby, the non-linear current-voltage characteristic of the memory cells is exploited in order to determine the second read voltage of each of the plurality N of resistive memory cells. For determining the second read voltage, at least the first read current measured at the memory cell and a predefined target read current is used. The determined second read voltage results in a confinement of the level distributions at the mean values which can enhance the effective signal-to-noise ratio (SNR) and improve the estimation and detection under small data records. This method can lead to a better error-rate performance. Further, by means of the present read measurement, drift can be compensated.

According to embodiments of the present invention, the resistive memory cell is a PCM cell (PCM, Phase Change Memory).

The PCM cell can be understood as a non-linear resistive device. The larger the amorphous size of the PCM cell the stronger is the non-linearity in the current-voltage characteristic at the cell-state read regime.

In an embodiment of the present invention, the second read voltage is determined such that the second read current is constant for all the memory cells programmed with the same programmable level from a plurality K of programmable levels. By exploiting the non-linear current-voltage-characteristics of the plurality N of resistive memory cells, a variable read voltage, here the second read voltage, determined for each cell can be used to read the different cells of the same programmable level with almost the same read current.

In a further embodiment of the present invention, the method includes determining one respective target read current for each of the plurality K of programmable levels. For an example that K=4, there are four programmable levels and therefore four different target read currents. By applying the first read voltage, each programmed cell can be mapped to one of the four target read currents.

In a further embodiment of the present invention, for each of the plurality K of programmable levels, the target read current is determined as the mean value of the first read currents of the plurality N of resistive memory cells programmed with the same programmable level.

For the above-mentioned example that K=4, there are four level means or mean distribution values for the target read currents. The level means is a good approximation for determining the respective target read currents.

In a further embodiment of the present invention, the target read currents for the plurality K of programmable levels are determined by a blind estimation. Within the blind estimation, a batch of the plurality N of resistive memory cells is read for estimating the target read currents.

In a further embodiment of the present invention, the target read currents for the plurality K of programmable levels is determined by using a plurality of reference cells. The memory cells and the reference cells are structurally identical.

In another embodiment of the present invention, for each of the plurality K of programmable levels, the target read currents are determined as the nominal read currents used when programming the cells to the plurality K of programmable levels. In particular in this embodiment of the present invention, the present method can easily compensate for drift.

In a further embodiment, the method includes mapping one target read current of the target read currents to the cell for each of the plurality N of resistive memory cells, and determining the second read voltage based on the first read current measured at the cell and the target read current mapped to the cell. Thus, one target read current can be mapped to each of the cells individually.

In a further embodiment, the step of mapping one target read current of the K target read currents to the plurality N of resistive cells includes: dividing a read current space of the first read current into a plurality K of distinct regimes and associating each target read current with one of the K distinct regimes, and for each of the plurality N of resistive memory cells, allocating the first read current measured at the memory cell to one of the K distinct regimes and mapping the target read current associated with the allocated distinct regime to the memory cell.

In another embodiment of the present invention, the plurality K of distinct regimes merge and are disjunct to each other, wherein the measured first read current is allocated to that of the plurality K of distinct regimes including a value corresponding to the measured first read current.

In a further embodiment of the present invention, the read current space is digitized by an analog-to-digital converter. By use of an analogue-to-digital converter, a direct mapping of voltage values and read currents is easily possible.

In a further embodiment of the present invention, for each of the plurality N of resistive memory cells, the second read voltage is calculated based on the first read current measured at the memory cell, the first read voltage and the target read current determined for the memory cell.

For example, the second read voltage can be calculated by: $V2=V1+k.\ln(It/I1)$, where V2 indicates the second read voltage, V1 the first read voltage, It the target read current determined for the memory cell, I1 the first read current measured at the memory cell at the read voltage V1, and $k>0$ is a constant which can be cell-state dependent.

According to an embodiment of a second aspect of the present invention, the present invention relates to a computer program including a program code for executing at least one step of the method of the first aspect for read measurement of a plurality N of resistive memory cells having a plurality K of programmable levels when run on at least one computer.

According to an embodiment of a third aspect of the present invention, an apparatus for read measurement of a plurality N of resistive memory cells having a plurality K of programmable levels is described. The apparatus includes a voltage generator for applying a voltage to the plurality N of resistive memory cells, a measurement circuit for making a measurement indicative of the cell current of the plurality N of resistive memory cells, and a controller for controlling operation of the apparatus such that the voltage generator applies a first read voltage to each of the plurality N of resistive memory cells, the measurement circuit measures a first read current due to the applied first read voltage at each of the plurality N of resistive memory cells, the controller determines a second read voltage for the plurality N of resistive memory cells based on the first read current measured at the memory cell and a target read current determined for the plurality N of resistive memory cells, and the voltage generator applies the respective determined second read voltage to the plurality N of resistive memory cells for obtaining a second read current for the plurality N of resistive memory cells.

According to an embodiment of a fourth aspect of the present invention, a resistive memory device is described. The resistive memory device includes a memory with a plurality N of resistive memory cells having a plurality K of programmable levels, and a read/write apparatus for reading and writing data in the plurality N of resistive memory cells, wherein the read/write apparatus includes an apparatus of above mentioned third aspect.

In the following, exemplary embodiments of the present invention are described with reference to the enclosed figures.

Embodiments of the present invention will now be described below with reference to the accompanying drawings. In the following description, elements that are identical are referenced by the same reference numbers in all the drawings unless noted otherwise. The configurations explained here are provided as preferred embodiments, and it should be understood that the technical scope of the present invention is not intended to be limited to these embodiments.

Figure 12:
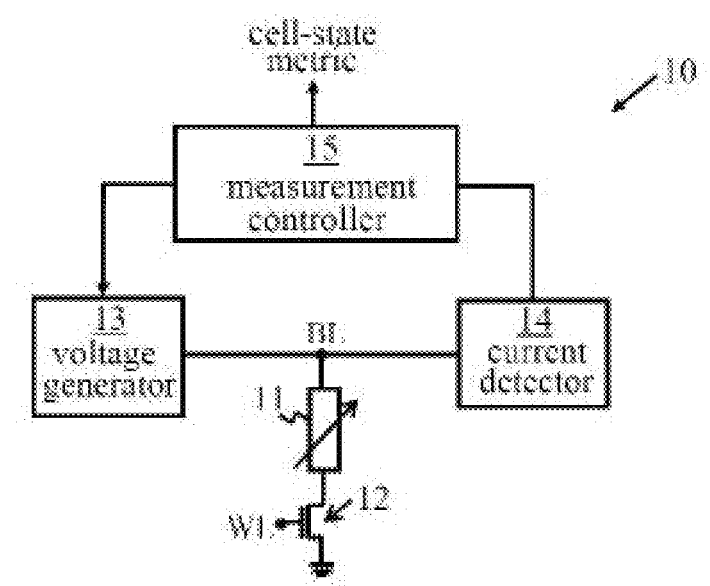
FIG. 12 shows an embodiment of the present invention, an apparatus for read measurement of a plurality of resistive memory cells.

In FIG. 1, according to an embodiment of the present invention, a sequence of method steps for read measurement of a plurality N of resistive memory cells having a plurality K of programmable levels is depicted. For example, K=4. The plurality N of resistive memory cells 11, shown in FIG. 12, is embodied by a PCM cell, PCM cell 11, for example. The respective PCM cell 11 is controllable by a first terminal connected to a bitline, BL, and by a second terminal connected to a wordline, WL (FIG. 12). Alternatively, a selection device with one terminal controlling the PCM cell 11 can be employed, as in the case of a diode (not shown).

In FIG. 1, a step 101, a first read voltage V1 is applied to each of the plurality N of resistive memory cells 11 (see FIG. 12) and, at each of the plurality N of resistive memory cells 11, a first read current I1 due to the applied first read voltage V1 is measured.

In step 102, for each of the plurality N of resistive memory cells 11, a respective second read voltage V2 is determined based on the first read current I1 measured at the plurality N of resistive memory cells 11 and a target read current It1-It4 determined for the N resistive memory cell 11. In particular, the respective second read voltage V2 is determined such that the second read current I2 is constant for all the plurality N of resistive memory cells 11 programmed with the same programmable level L1-L4, from a plurality K of programmable levels. Thus, one respective target current It1-It4 is determined for each of the plurality K of programmable levels. For the example that K=4, there are four different target read currents It1-It4 for the four different programmable levels L1-L4. For example, for each of the four programmable levels L1-L4, the target read current It1-It 4 is determined as the mean value of the first read current I1 of the plurality N of resistive memory cells 11 programmed with the same programmable level L1-L4. For determining the target read currents It1-It4, a blind estimation can be used. Within such a blind estimation, a batch of the plurality N of resistive memory cells 11 can be read for estimating the four target read currents It1-It4. Alternatively, a plurality of reference cells can be used for determining the four target read currents It1-It4.

In step 103, for each of the plurality N of resistive memory cells 11, the respective determined second read voltage V2 is applied to the memory cell 11 for obtaining a second read current I2.

Figure 2:
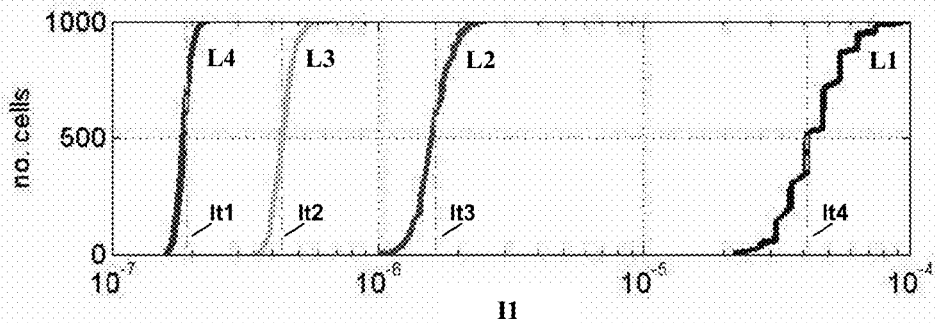
FIGS. 2-4 illustrate the use of variable read voltages to confine MLC distributions, according to an embodiment of the present invention.
Figure 4:
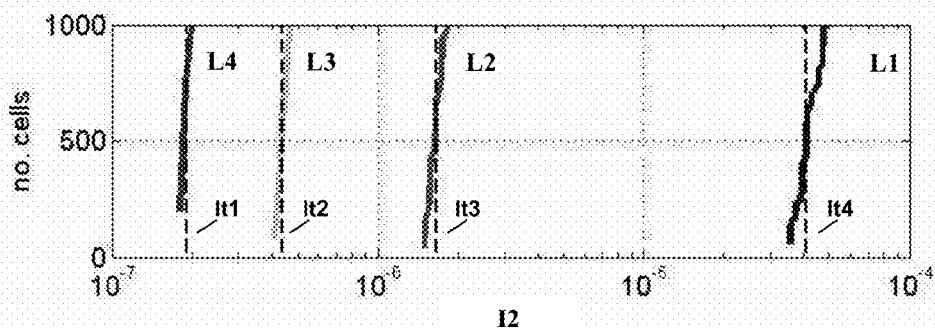
Figure 3:
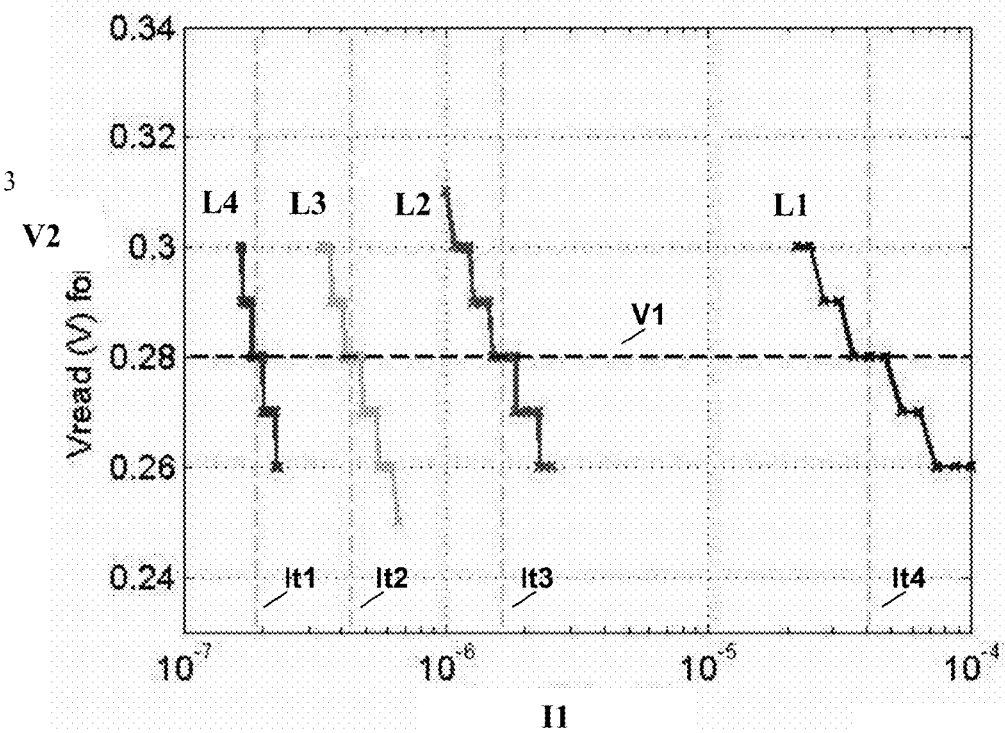

In FIGS. 2-4, an example is shown which illustrates the use of variable read voltages to confine MLC distributions. In this regard, FIG. 2 depicts an example of a histogram of read current values for a fixed first read voltage V1 (step 101 of FIG. 1). FIG. 3 depicts a diagram illustrating read voltage waveforms as a function of the first read current I1 due to the applied first read voltage V1, and FIG. 4 depicts an example of a histogram of the read current values for a variable second read voltage adjusted by means of FIG. 3. In the example of FIGS. 2-4, K=4, and therefore four levels L1-L4 and four target read currents It1-It4 are used.

In FIG. 2, the histogram shows four distributions for the four levels L1-L4 which are around their respective mean value. The read voltage waveforms of FIG. 3 have a 10 mV resolution and are a function of the first read current I1 at the first read voltage V1 and the target read current It1-It4. In this example V1 is 0.28V and the target read currents It1-It4 correspond to the mean values of the four distributions L1-L4. Also, the curves in FIG. 3 show how the second read voltage V2 is shaped as a function of the first read current I1 and the respective target read current It1-It4. When the read current I1 is lower than the target value It1-It4 then the read current I2, here the second read current, has to be increased. Accordingly, when the read current I1 is higher than the respective target value then the read current, here the second read current I2 has to be decreased. For each of the four level distributions L1-L4, the new read voltage as shown in FIG. 3, namely the second read voltage can be applied in step 103 of FIG. 1. Comparing FIGS. 2 and 4, the distributions in FIG. 4 are tighter resulting in a higher signal-to-noise ratio (SNR).

Figure 5:
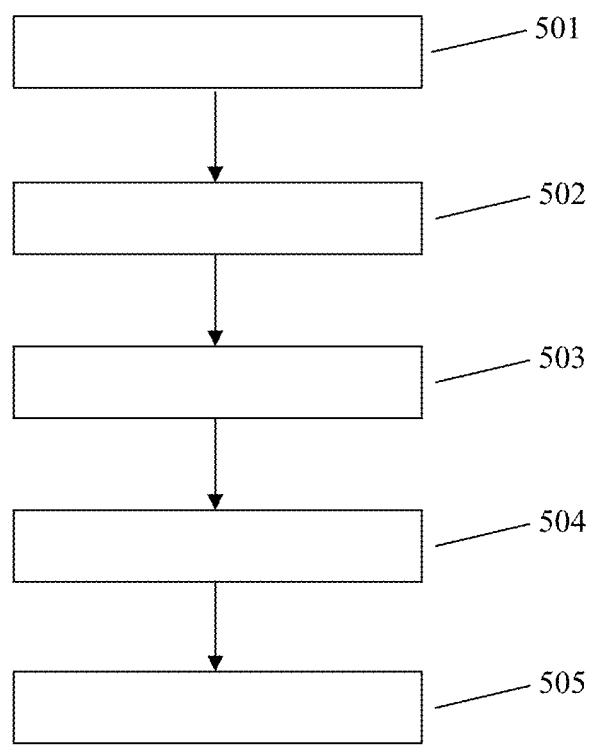
FIG. 5 shows a sequence of method steps for read measurement of a plurality of resistive memory cells, according to an embodiment of the present invention

In FIG. 5, according to a second embodiment of the present invention, a sequence of method steps for read measurement of a plurality N of resistive memory cells 11 having a plurality K of programmable levels L1-L4 is shown. This second embodiment is also explained with reference to FIGS. 6-8.

In step 501, a first read voltage V1 is applied to each of the plurality N of resistive memory cells 11 (see FIG. 12) and, at each of the plurality N of resistive memory cells 11, a first read current I1 due to the applied first read voltage V1 is measured.

Figure 7:
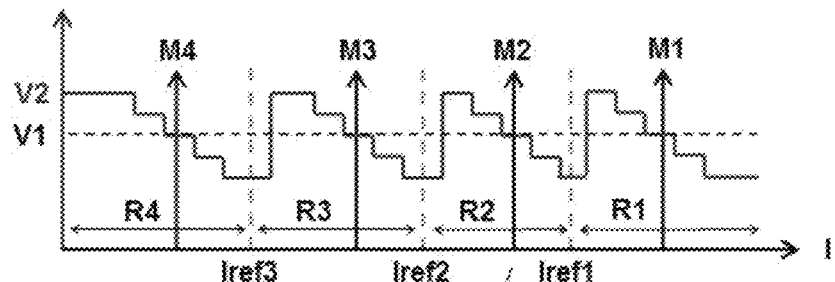

In step 502, a read current space of the first read current I1 is divided into a plurality K of distinct regimes R1-R4 and each target read current It1-It4 is associated with one of the plurality K of distinct regimes R1-R4. In FIG. 7, K=4 and the reference currents Iref1-Iref3 are used to define the four distinct regimes R1-R4.

In step 503, for each of the plurality N of resistive memory cells 11, the first read current I1 measured at the plurality N of resistive memory cells 11 is allocated to one of the plurality K of distinct regimes R1-R4 and the target read current It1-It4 is associated with the allocated K distinct regime R1-R4 is mapped to the plurality N of resistive memory cells 11.

In step 504, the second read voltage V2 is determined based on the first read current I1 measured at the plurality N of resistive memory cells 11 and the target read current It1-It4 mapped to the plurality N of resistive memory cells 11.

In step 505, for each of the plurality N of resistive memory cells 11, the respective determined second read voltage V2 is applied to the plurality N of resistive memory cells 11 for obtaining a second read current I2.

Figure 6:
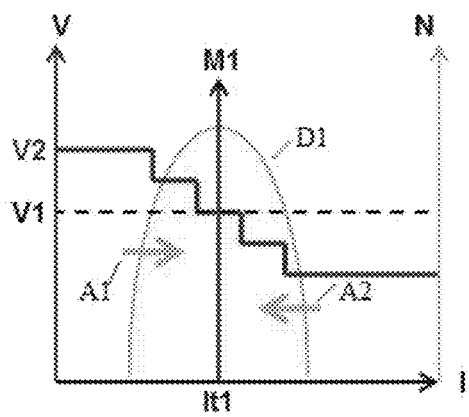
FIGS. 6-8 show graphs illustrating shaping the read voltage for MLC distributions, according to embodiments of the present invention.
Figure 8:
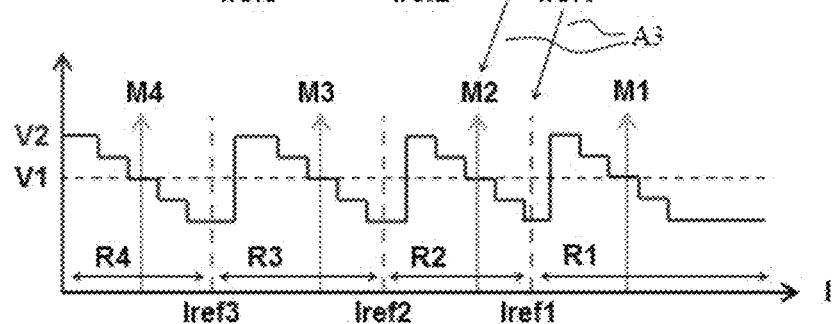

In FIGS. 6-8, an example is depicted for the shaping of the read voltage V2 for MLC distributions. In this regard, FIG. 6 shows a level distribution D1 at the first level L1 where the mean of the distribution is characterized by M1. V1 indicates the first read voltage (step 501 of FIG. 5), where V2 indicates the second read voltage (see step 504 of FIG. 5). The target read current It1 equals the mean value of the read current of the distribution D1 when using the first read voltage V1. The arrow A1 illustrates that a higher voltage is used for the second read voltage V2 for the plurality N of resistive memory cells 11 with a first read current at V1 which is lower than the mean value. In contrast, the arrow A2 shows that a lower voltage is used for the second read voltage V2 for the plurality N of resistive memory cells 11 with a first read current at V1 which is higher than the mean value. A corresponding example for the four programmable levels L1-L4 is depicted in FIG. 7, where M1-M4 show the mean current values for the four programmable levels L1-L4 at the first read voltage V1. Estimation of the programmable level means based on blind estimation techniques or reference cells can be used in order to track temporal variations of the MLC distributions due to drift, according to embodiments of the present invention. Then arrows A3 in FIG. 8 illustrate that both the target currents It1-1t4 and the reference currents Iref1-Iref3 can be adjusted by tracking the level means during drift using reference cells or blind estimation techniques. Comparing FIGS. 8 and 7, one can recognize that the present shaping of the read voltage V2 can be easily adjusted in order to follow drift.

Figure 9:
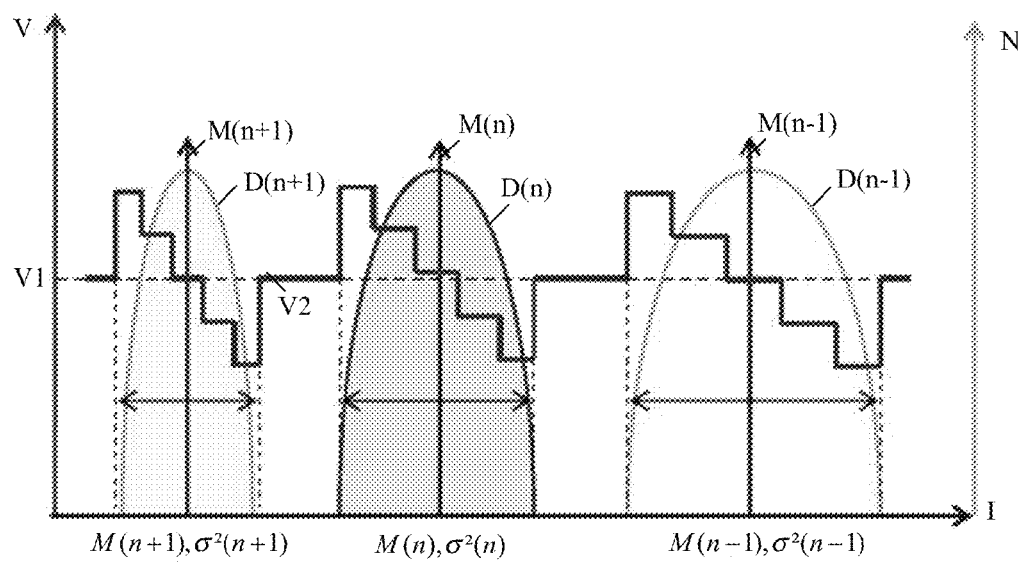
FIG. 9 shows the design of a read voltage function for a second read voltage, according to embodiments of the present invention.

In FIG. 9, an example for the design of the read voltage function for the second read voltage V2 is depicted in detail for the general case of levels n−1, n and n+1.

The boundaries for the negative feedback second read voltage V2 can be determined by a second-order statistics estimate for each level n−1, n, n+1 using either blind estimation techniques or reference cells. As a practical example, a rule of $-/+k\sigma^2$ around the mean value M can be used, e.g. k=4 or 5.

In a case of a distribution overlap, the reference current values Iref1-Iref3 used to select the correct target current It1-It4 can serve as boundaries (see FIG. 7).

Figure 10:
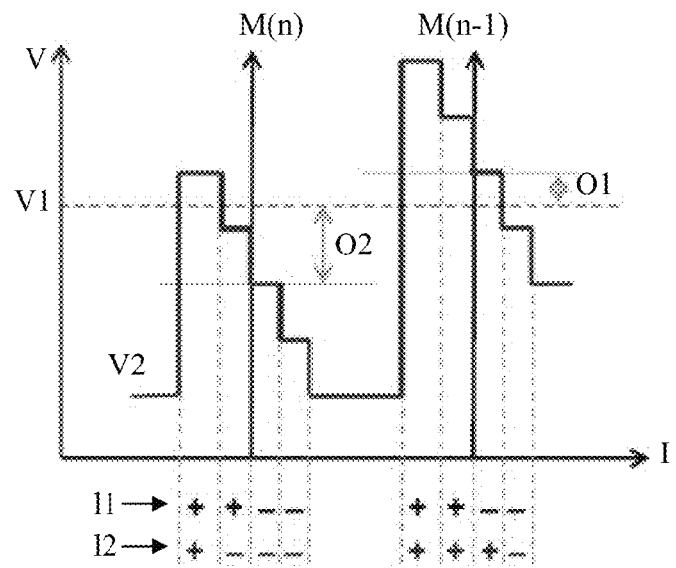
FIGS. 10-11 show the design of a read voltage function for a second read voltage, according to embodiments of the present invention.
Figure 11:
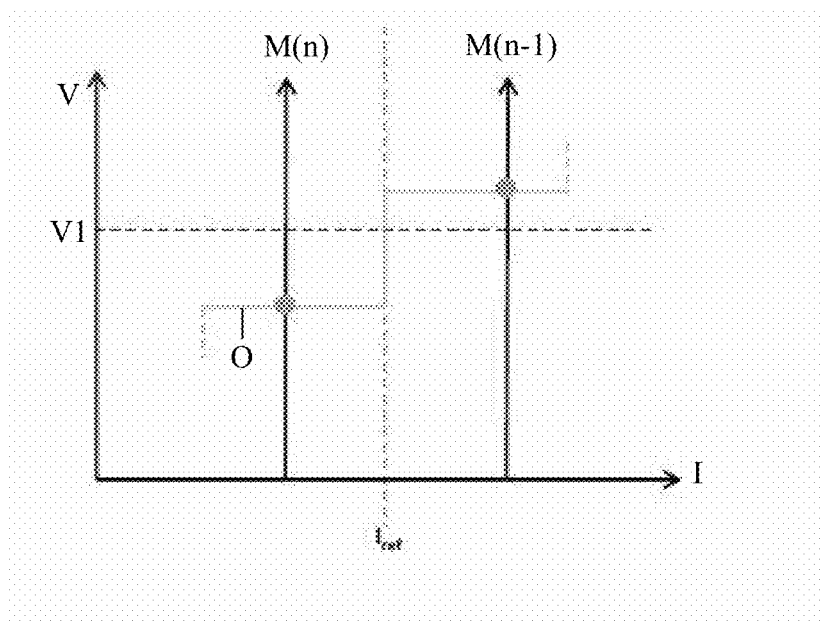

In FIGS. 10 and 11, an example is given for the design of a read voltage function for the second read voltage V2.

In FIG. 10, O1 shows a positive offset, wherein O2 shows a negative offset. Further, the following actions can be derived from lines I1 and I2 of FIG. 10: in line |1: +/−: increase/decrease of the read current with respect to the mean of the distribution, and in line I2: +/−: increase/decrease of the read current with respect to the value at the first read voltage V1.

For the examples of FIGS. 10 and 11, the following equation can be used: $V_{offs} = V1 - \beta \log(I_{ref}/I1)$, $\beta > 0$. The offset $V_{offs}$ with respect to the first read voltage V1 can be calculated based on the reference currents Iref that are used to divide the current space (see FIG. 7, for example). Then, the locally shaped second read voltage V2 is used to confine the MLC distributions. The combined result can then be used to enhance the signal-to-noise ratio (SNR) which will ultimately lead to a better error-rate performance.

FIG. 12 shows an embodiment of an apparatus 10 for a read measurement of a plurality N of resistive memory cells 11 having a plurality K of programmable levels L1-L4. Without loss of generality and because of illustration, FIG. 12 shows only one N resistive memory cell 11. The apparatus 10 of FIG. 12 can be called read measurement apparatus and can be included in a read/write apparatus. The apparatus 10 is connected to the N resistive memory cell 11, for example a PCM cell 11, according to embodiments of the present invention. In FIG. 12, the PCM cell 11 is represented as a variable resistance. The N resistive memory cell 11 is assessed via appropriate voltages applied to the appropriate wordline, WL, and bitline, BL, for the N resistive memory cell 11.

An access device 12, here a field-effect transistor (FET) 12, according to an embodiment of the present invention, is connected in series with the N resistive memory cell 11 for controlling the access to the N resistive memory cell 11. The gate of the FET 12 is connected to the wordline, WL, whereby application of a wordline, WL, voltage switches on FET 12, allowing current to flow in N resistive memory cell 11.

The apparatus 10 includes a voltage generator 13 for applying a voltage, here a read voltage V1, V2, to the cell bitline, BL. The apparatus 10 also includes a measurement circuit, for example a current detector 14, for making a measurement indicative of current I1, 12 flowing through the N resistive memory cell 11 due to the applied read voltage V1, V2. Further, the apparatus 10 includes a controller 15, a so-called measurement controller 15, for controlling the operation of the apparatus 10. The measurement controller 15 receives the output of the current detector 14 and controls the generation of the voltage generator 13 to implement the following: In particular, the controller 15 is adapted to control the operation of the apparatus 10 such that the voltage generator 13 applies a first read voltage V1 to each of the plurality N of resistive memory cells 11. The measurement circuit 14 measures a first read current I1 due to the applied first read voltage V1 at each of the plurality N of resistive memory cells 11. Further, the controller 15 determines a respective second read voltage V2 for each of the plurality N of resistive memory cells 11 based on the first read current I1 measured at the memory cell 11 and the target read current It1 -It4 determined for the respective memory cell 11. Then, the voltage generator 13 applies to the respective determined second read voltage V2 to the memory cell 11 for obtaining a second read current I2 for each of the plurality N of resistive memory cells 11.

Computerized devices can be suitably designed for implementing embodiments of the present invention as described herein. In that respect, it can be appreciated that the methods described herein are largely non-interactive and automated. In exemplary embodiments of the present invention, the methods described herein can be implemented either in an interactive, partly-interactive or non-interactive system. The methods described herein can be implemented in software (e.g., firmware), hardware, or a combination thereof. In exemplary embodiments, the methods described herein are implemented in software, as an executable program, the latter executed by suitable digital processing devices. In further exemplary embodiments, at least one step or all steps of above method of FIG. 1 or 5 can be implemented in software, as an executable program, the latter executed by suitable digital processing devices. More generally, embodiments of the present invention can be implemented wherein general-purpose digital computers, such as personal computers, workstations, etc., are used.

Figure 13:
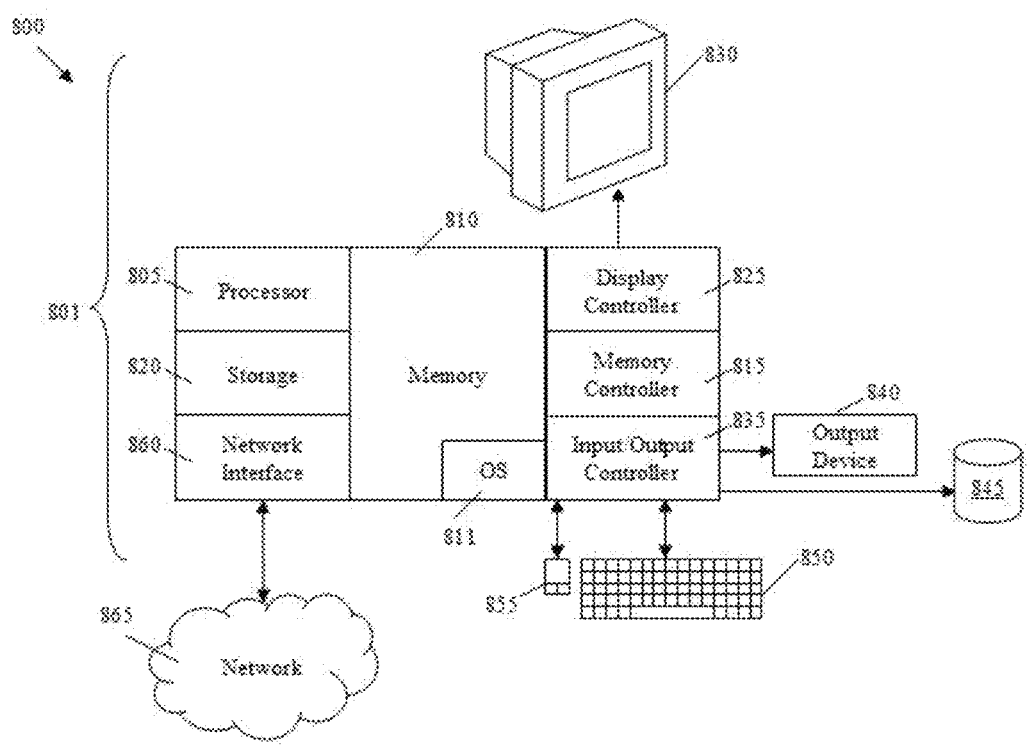
FIG. 13 shows a schematic block diagram, according to an embodiment of the present invention, of a system adapted for performing the method for read measurement of a plurality of resistive memory.

For instance, the system 800 depicted in FIG. 13 schematically represents a computerized unit 801, e.g., a general-purpose computer. For example, the system 800 can include an apparatus 10 as shown in FIG. 12. In exemplary embodiments of the present invention, in terms of hardware architecture, as shown in FIG. 13, the unit 801 includes a processor 805, memory 810 coupled to a memory controller 815, and one or more input and/or output (I/O) devices 840, 845, 850, 855 (or peripherals) that are communicatively coupled via a local input/output controller 835. In particular, the memory controller 815 can include the apparatus 10 of FIG. 12. The input/output controller 835 can be, but is not limited to, one or more buses or other wired or wireless connections, as is known in the art. The input/output controller 835 can have additional elements, which are omitted for simplicity, such as controllers, buffers (caches), drivers, repeaters, and receivers, to enable communications. Further, the local interface can include address, control, and/or data connections to enable appropriate communications among the aforementioned components.

The processor 805 is a hardware device for executing software, particularly that stored in memory 810. The processor 805 can be any custom made or commercially available processor, a central processing unit (CPU), an auxiliary processor among several processors associated with the computer 801, a semiconductor based microprocessor (in the form of a microchip or chip set), or generally any device for executing software instructions.

The memory 810 can include any one or combination of volatile memory elements (e.g., random access memory) and nonvolatile memory elements. Moreover, the memory 810 can incorporate electronic, magnetic, optical, and/or other types of storage media. Note that the memory 810 can have a distributed architecture, where various components are situated remote from one another, but can be accessed by the processor 805.

The software in memory 810 can include one or more separate programs, each of which includes an ordered listing of executable instructions for implementing logical functions. In the example of FIG. 13, the software in the memory 810 includes methods described herein in accordance with exemplary embodiments and a suitable operating system (OS) 811. The OS 811 essentially controls the execution of other computer programs, such as the methods as described herein (e.g., FIG. 1 or 5), and provides scheduling, input-output control, file and data management, memory management, and communication control and related services.

The methods described herein can be in the form of a source program, executable program (object code), script, or any other entity including a set of instructions to be performed. When in a source program form, then the program needs to be translated via a compiler, assembler, interpreter, or the like, as known per se, which can be included within the memory 810, so as to operate properly in connection with the OS 811. Furthermore, the methods can be written as an object oriented programming language, which has classes of data and methods, or a procedure programming language, which has routines, subroutines, and/or functions.

Possibly, a conventional keyboard 850 and mouse 855 can be coupled to the input/output controller 835. Other I/O devices 840-855 can include sensors (especially in the case of network elements), i.e., hardware devices that produce a measurable response to a change in a physical condition like temperature or pressure (physical data to be monitored). Typically, the analog signal produced by the sensors is digitized by an analog-to-digital converter and sent to controllers 835 for further processing. Sensor nodes are ideally small, consume low energy, are autonomous and operate unattended.

In addition, the I/O devices 840-855 can further include devices that communicate both inputs and outputs. The system 800 can further include a display controller 825 coupled to a display 830. In exemplary embodiments of the present invention, the system 800 can further include a network interface or transceiver 860 for coupling to a network 865.

The network 865 transmits and receives data between the unit 801 and external systems. The network 865 is possibly implemented in a wireless fashion, e.g., using wireless protocols and technologies, such as IEEE 802.15.4 or similar. The network 865 can be a fixed wireless network, a wireless local area network (LAN), a wireless wide area network (WAN) a personal area network (PAN), a virtual private network (VPN), intranet or other suitable network system and includes equipment for receiving and transmitting signals.

When the unit 801 is in operation, the processor 805 is configured to execute software stored within the memory 810, to communicate data to and from the memory 810, and to generally control operations of the computer 801 pursuant to the software. The methods described herein and the OS 811, in whole or in part are read by the processor 805, typically buffered within the processor 805, and then executed. When the methods described herein (e.g. with reference to FIG. 1 or 5) are implemented in software, the methods can be stored on any computer readable medium, such as storage 820, for use by or in connection with any computer related system or method.

As will be appreciated by one skilled in the art, aspects of the present invention may be embodied as a system, method or computer program product. Accordingly, aspects of the present invention can take the form of an entirely hardware embodiment, an entirely software embodiment (including firmware, resident software, micro-code, etc.) or an embodiment combining software and hardware aspects. Furthermore, aspects of the present invention can take the form of a computer program product embodied in one or more computer readable medium(s) having computer readable program code embodied thereon. Any combination of one or more computer readable medium(s) can be utilized. The computer readable medium can be a computer readable signal medium or a computer readable storage medium. A computer readable storage medium can be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium can be any tangible medium that can contain, or store a program for use by or in connection with an instruction execution system, apparatus, or device.

A computer readable signal medium can include a propagated data signal with computer readable program code embodied therein, for example, in baseband or as part of a carrier wave. Such a propagated signal can take any of a variety of forms, including, but not limited to, electro-magnetic, optical, or any suitable combination thereof. A computer readable signal medium can be any computer readable medium that is not a computer readable storage medium and that can communicate, propagate, or transport a program for use by or in connection with an instruction execution system, apparatus, or device. Program code embodied on a computer readable medium can be transmitted using any appropriate medium, including but not limited to wireless, wireline, optical fiber cable, RF, etc., or any suitable combination of the foregoing.

Computer program code for carrying out operations for aspects of the present invention can be written in any combination of one or more programming languages, including an object oriented programming language such as Java, Smalltalk, C++ or the like and conventional procedural programming languages, such as the "C" programming language or similar programming languages. The program code can execute entirely on the unit 801, partly thereon, partly on a unit 801 and another unit 801, similar or not.

Aspects of the present invention are described above with reference to flowchart illustrations and/or block diagrams of methods, apparatus (systems) and computer program products according to embodiments of the invention. It will be understood that each block of the flowchart illustrations and/or block diagrams can be implemented by one or more computer program instructions. These computer program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

The computer program instructions can also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams can represent a module, segment, or portion of code, which includes one or more executable instructions for implementing the specified logical function(s). It should also be noted that, in some alternative implementations, the functions noted in the blocks can occur out of the order noted in the figures. For example, two blocks shown in succession can, in fact, be executed substantially concurrently, or the blocks can sometimes be executed in the reverse order, depending upon the functionality involved and algorithm optimization. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

More generally, while the present invention has been described with reference to certain embodiments, it will be understood by those skilled in the art that various changes can be made and equivalents may be substituted without departing from the scope of the present invention. In addition, many modifications may be made to adapt a particular situation to the teachings of the present invention without departing from its scope. Therefore, it is intended that the present invention not be limited to the particular embodiments disclosed, but that the present invention will include all embodiments falling within the scope of the appended claims.

What is claimed is:

1. A method for read measurement of a plurality N of resistive memory cells having a plurality K of programmable levels, the method comprising:
   applying a first read voltage to the plurality N of resistive memory cells;
   measuring a first read current due to the first read voltage;
   determining a second read voltage based on the first read current measured at the plurality N of resistive memory cells;
   determining a target read current for the plurality N of resistive memory cells;
   applying the second read voltage to the plurality N of resistive memory cells;
   obtaining a second read current;
   determining a target read current for each of the plurality K of programmable levels
   mapping the target read current for each of the plurality K of programmable levels; and
   determining the second read voltage based on the first read current and the target read current for each of the plurality K programmable levels;
   wherein mapping the target read current for each of the plurality K of programmable levels comprises:
   dividing a read current space for the first read current into a plurality K of distinct regimes;
   associating the target read current for each of the plurality K of programmable levels with the plurality K of distinct regimes;
   allocating the first read current to the plurality K of distinct regimes; and
   mapping the target read current for each of the plurality K of programmable levels and the target read current for the plurality N of resistive memory cells with the plurality K of distinct regimes.

2. The method of claim 1, wherein the second read voltage is determined such that the second read current is constant for the plurality N of resistive memory cells programmed with the plurality K of programmable levels.

3. The method of claim 1, wherein the target read current is determined as a mean value of the first read current of the plurality N of resistive memory cells programmed with the plurality K of programmable levels.

4. The method of claim 1, wherein the target read current for the plurality K of programmable levels is determined by a blind estimation.

5. The method of claim 4, further comprising:
reading a batch of the plurality N of resistive memory cells to estimate the target read current.

6. The method of claim 1, wherein the target read currents for the plurality K of programmable levels are determined by using a plurality of reference cells.

7. The method of claim 6, wherein the plurality N of resistive memory cells and the plurality of reference cells are structurally identical.

8. The method of claim 1, wherein the target read current for the plurality K of programmable levels is determined as a nominal read current when programming the plurality N of resistive memory cells to the plurality K of programmable levels.

9. The method of claim 1, wherein the plurality K of distinct regimes merge and are disjunct to each other, and wherein the first read current is allocated to that of the plurality K of distinct regimes including a value corresponding to the first read current.

10. The method of claim 1, wherein the read current space is digitized by an analog-to-digital converter.

11. The method of claim 1, wherein the second read voltage is calculated based on the first read current, the first read voltage, and the target read current for the plurality N of resistive memory cells.

12. An apparatus for read measurement of a plurality N of resistive memory cells having a plurality K of programmable levels, the apparatus comprising:
a voltage generator for applying a voltage to the plurality N of resistive memory cells;
a measurement circuit for making a measurement indicative of cell current;
a controller for controlling operation;
wherein the voltage generator applies a first read voltage to the plurality N of resistive memory cells;
wherein the measurement circuit measures a first read current due to the first read voltage;
wherein the controller:
  determines a second read voltage for the plurality N of resistive memory cells based on the first read current and a target read current determined for the plurality N of resistive memory cells;
  determines and maps a target read current for each of the plurality K of programmable levels;
  determines the second read voltage for each of the plurality K programmable levels based on the first read current and the target read current:
wherein the controller maps the target read current for each of the plurality K of programmable levels by:
  dividing a read current space for the first read current into a plurality K of distinct regimes;
  associating the target read current for each of the plurality K of programmable levels with the plurality K of distinct regimes;
  allocating the first read current to the plurality K of distinct regimes; and
  mapping the target read current for each of the plurality K of programmable levels and the target read current for the plurality N of resistive memory cells with the plurality K of distinct regimes: and
wherein the voltage generator applies the second read voltage to the plurality N of resistive memory cells for obtaining a second read current for the plurality N of resistive memory cells.

13. A resistive memory device comprising:
a memory including a plurality N of resistive memory cells having a plurality K of programmable levels;
a voltage generator for applying a voltage to the plurality N of resistive memory cells;
a measurement circuit for making a measurement indicative of cell current;
a controller for controlling operation;
wherein the voltage generator applies a first read voltage to the plurality N of resistive memory cells;
wherein the measurement circuit measures a first read current due to the first read voltage;
wherein the controller:
  determines a second read voltage for the plurality N of resistive memory cells based on the first read current and a target read current determined for the plurality N of resistive memory cells;
  determines and maps a target read current for each of the plurality K of programmable levels;
  determines the second read voltage for each of the plurality K programmable levels based on the first read current and the target read current;
wherein the controller maps the target read current for each of the plurality K of programmable levels by:
  dividing a read current space for the first read current into a plurality K of distinct regimes;
  associating the target read current for each of the plurality K of programmable levels with the plurality K of distinct regimes:
  allocating the first read current to the plurality K of distinct regimes; and
  mapping the target read current for each of the plurality K of programmable levels and the target read current for the plurality N of resistive memory cells with the plurality K of distinct regimes: and
wherein the voltage generator applies the second read voltage to the plurality N of resistive memory cells for obtaining a second read current for the plurality N of resistive memory cells.

* * * * *